United States Patent
Chang et al.

(10) Patent No.: US 9,287,276 B2
(45) Date of Patent: Mar. 15, 2016

(54) MEMORY CELL ARRAY

(71) Applicant: TAIWAN SEMICONDUCTOR MANUFACTURING COMPANY, LTD., Hsinchu (TW)

(72) Inventors: Shi-Wei Chang, Hsinchu (TW); Hong-Chen Cheng, Hsinchu (TW); Chien-Chi Tien, Hsinchu (TW); Li-Chun Tien, Tainan (TW); Kuo-Hua Pan, Hsinchu (TW); Jhon-Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 87 days.

(21) Appl. No.: 13/946,819

(22) Filed: Jul. 19, 2013

(65) Prior Publication Data

US 2015/0021701 A1    Jan. 22, 2015

(51) Int. Cl.
*H01L 27/115* (2006.01)
*H01L 27/112* (2006.01)
*G11C 17/10* (2006.01)

(52) U.S. Cl.
CPC .............. *H01L 27/115* (2013.01); *G11C 17/10* (2013.01); *H01L 27/1122* (2013.01)

(58) Field of Classification Search
USPC .......................................... 257/368; 438/586
See application file for complete search history.

(56) References Cited

U.S. PATENT DOCUMENTS

| | | | |
|---|---|---|---|
| 2008/0079481 A1* | 4/2008 | Tomita | 327/543 |
| 2009/0250735 A1* | 10/2009 | Asao | 257/295 |
| 2011/0069534 A1* | 3/2011 | Inaba | 365/158 |
| 2013/0242644 A1* | 9/2013 | Lin | G11C 11/412 |
| | | | 365/154 |

* cited by examiner

*Primary Examiner* — Zandra Smith
*Assistant Examiner* — Lawrence Tynes, Jr.
(74) *Attorney, Agent, or Firm* — McDermott Will & Emery LLP

(57) ABSTRACT

A semiconductor memory cell array is disclosed that includes a memory cell unit. The memory cell unit includes an active region, a first transistor, a second transistor, a gate structure, and an interconnect. The first transistor and the second transistor are formed on the active region. The gate structure is formed on the active region and between the first transistor and the second transistor. The interconnect connects the gate structure and at least one of sources of the first transistor and the second transistor to a power line.

22 Claims, 10 Drawing Sheets

MEMORY CELL ARRAY

FIELD

The present disclosure relates to a semiconductor memory cell array.

BACKGROUND

Size and performance of a semiconductor memory are an issue during manufacturing of the semiconductor memory. For example, in a read-only-memory (ROM), a contact for a ground voltage is used for a number of cells to function. However, the contact occupies layout areas. As a result, the size of the ROM increases. Moreover, the cells are connected to and share the same contact. Therefore, resistance associated with the connections between the contact and the cells increases. As a result, the performance of the semiconductor ROM is affected.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
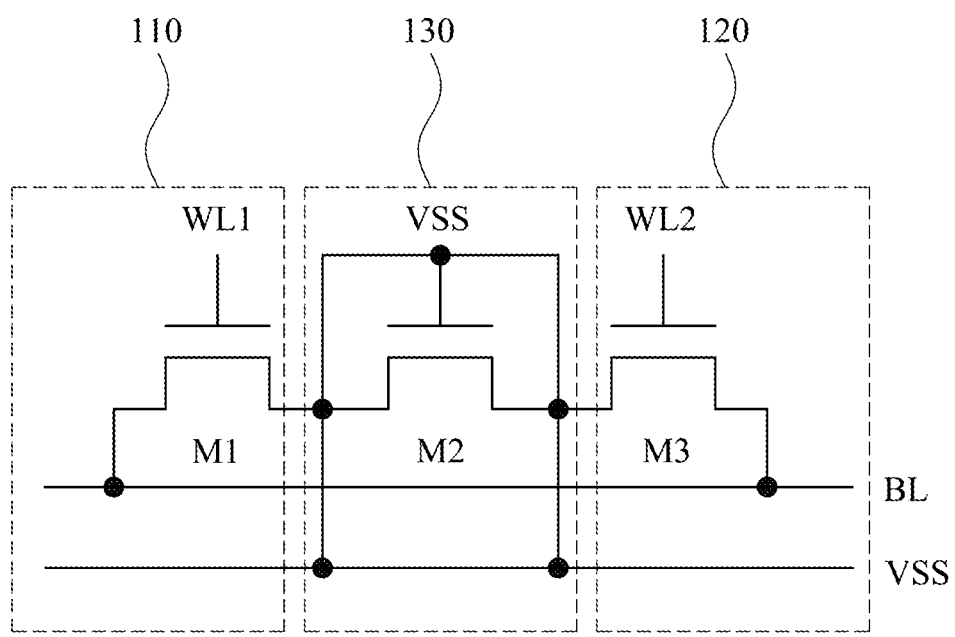
FIG. 1 is a schematic diagram of a semiconductor memory cell unit in accordance with some embodiments of the present disclosure.

FIG. 1 is a schematic diagram of a semiconductor memory cell unit 100 in accordance with some embodiments of the present disclosure. In some embodiments, the memory cell unit 100 is a part of a memory cell array which, in some embodiments, is a read-only-memory (ROM) cell array. For illustration, two exemplary memory cells 110 and 120 and a dummy cell 130 connected therebetween are provided in the memory cell unit 100. The dummy cell 130 is used to electrically isolate the memory cells 110 and 120.

In the memory cell 110, an NMOS transistor M1 has a gate terminal connected to a word line WL1, a drain terminal connected to a bit line BL, and a source terminal connected to a reference voltage VSS. In some embodiments, the reference voltage VSS is a ground voltage. In the memory cell 120, an NMOS transistor M3 has a gate terminal connected to a word line WL2, a drain terminal connected to the bit line BL, and a source terminal connected to VSS. In the dummy cell 130, an NMOS transistor M2 is connected between the source terminals of the transistors M1 and M3. The transistor M2 has a gate terminal, a drain terminal, and a source terminal all connected to VSS.

The number and configuration of the memory cells in FIG. 1 are for illustrative purposes. Various numbers and configurations of memory cells in the memory cell unit 100 to perform the corresponding function of the memory cell unit 100 are within the contemplated scope of the present disclosure.

In operation, the transistor M2 is turned off by VSS. Effectively, the transistor M2 isolates the transistors M1 and M3. Moreover, when the memory cell 110 is selected, the word line WL1 is activated. Therefore, the transistor M1 is turned on to pull the bit line BL at the drain terminal of the transistor M1 to VSS at the source terminal of the transistor M1. As a result, the voltage value of the bit line BL is changed to VSS through the transistor M1. In some embodiments, VSS read out through the bit line BL indicates a logical value "0." Accordingly, due to the configuration of the memory cell 110, the memory cell 110 stores the logical value "0."

Similarly, when the memory cell 120 is selected, the word line WL2 is activated. Therefore, the transistor M3 is turned on to pull the bit line BL at the drain terminal of the transistor M3 to VSS at the source terminal of the transistor M3. As a result, the voltage value of the bit line BL is changed to VSS through the transistor M3. Accordingly, due to the configuration of the memory cell 120, the memory cell 120 stores the logical value "0."

Therefore, in the memory cell unit 100, the memory cells 110 and 120 store the logical value "0" and the logical value "0," respectively.

Figure 2A:
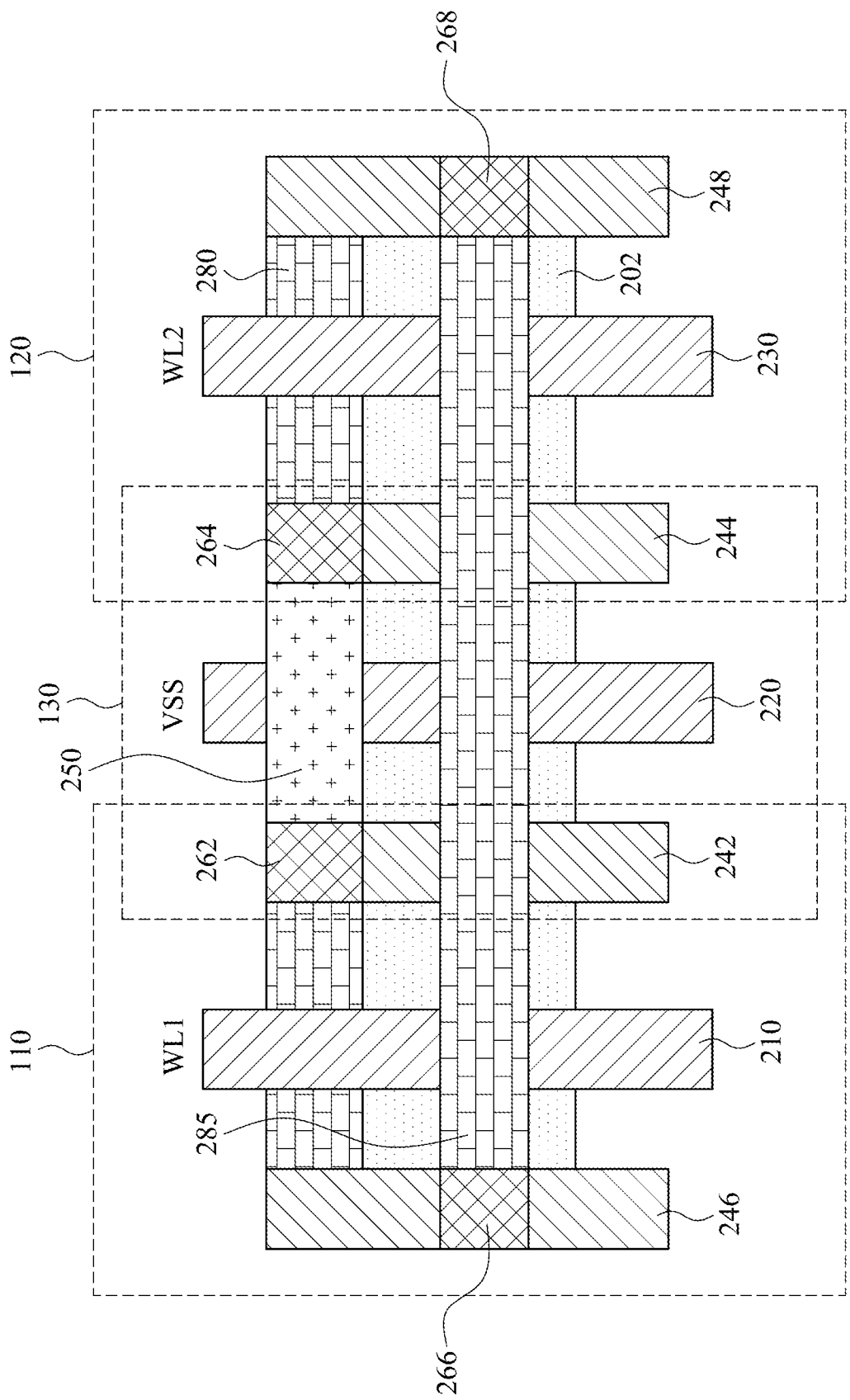
FIG. 2A is a layout diagram illustrating a layout implementation of the semiconductor memory cell unit in FIG. 1, in accordance with some embodiments of the present disclosure.

FIG. 2A is a layout diagram 200A illustrating a layout implementation of the memory cell unit 100 in FIG. 1, in accordance with some embodiments of the present disclosure. The layout 200A includes layouts of the memory cells 110 and 120 and the dummy cell 130 in FIG. 1.

Figure 2B:
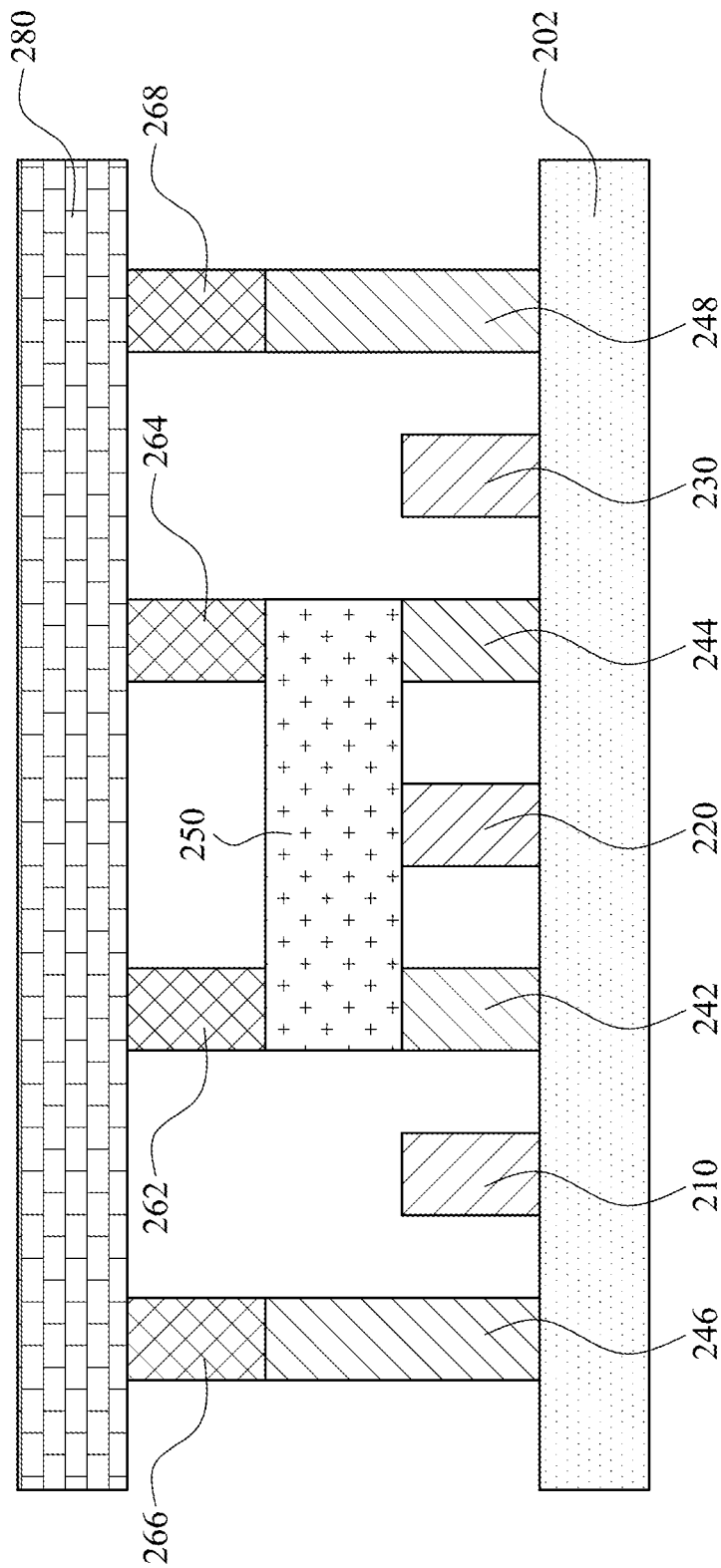
FIG. 2B is a schematic diagram illustrating a cross-sectional view of the layout implementation in FIG. 2A, in accordance with some embodiments of the present disclosure.

FIG. 2B is a schematic diagram illustrating a side view of the layout 200A in FIG. 2A, in accordance with some embodiments of the present disclosure. Details of the layout 200A in FIG. 2A and its side view in FIG. 2B are explained with reference to FIG. 1 and FIG. 3.

Figure 3:
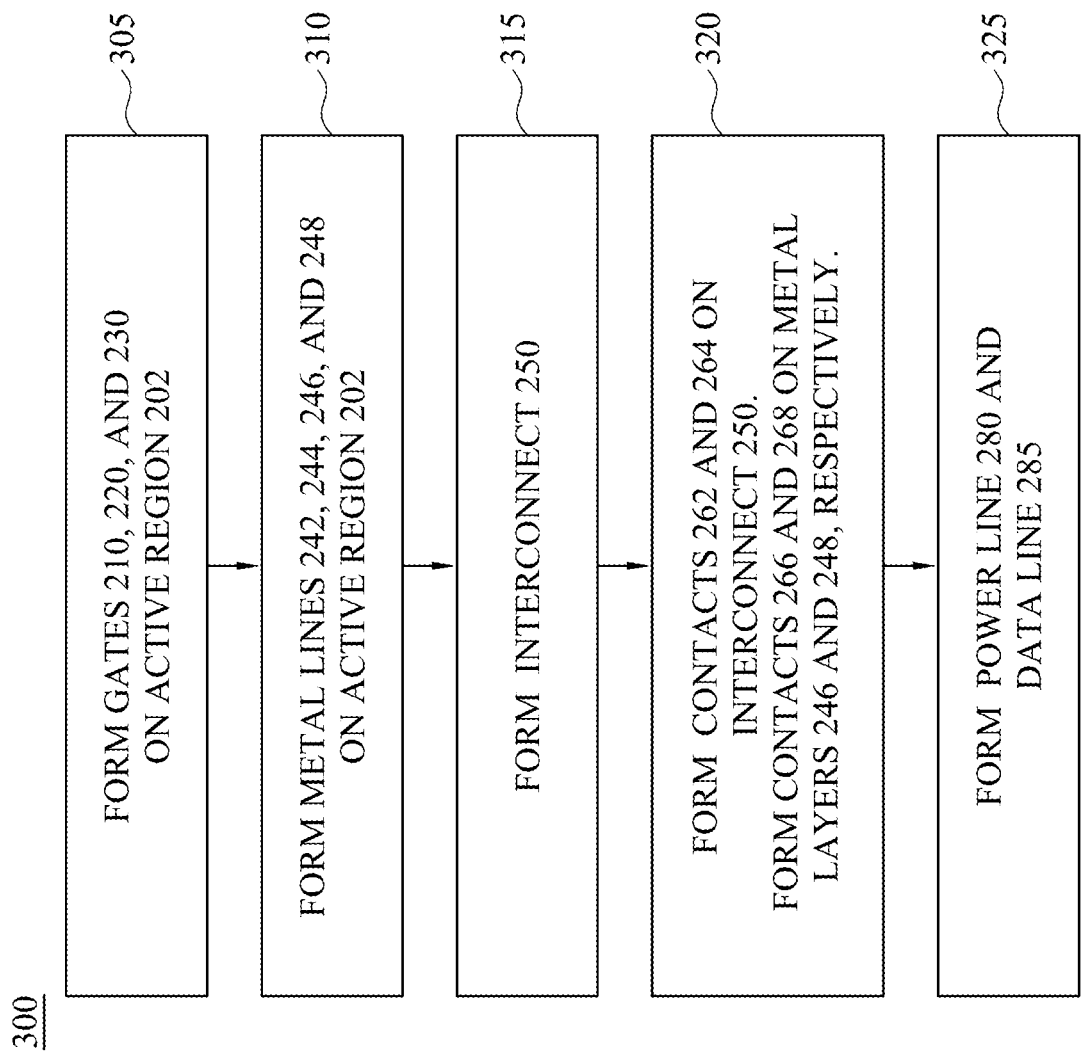
FIG. 3 is a flow chart of a method illustrating the manufacturing process of the layout implementation in FIG. 2A, in accordance with some embodiments of the present disclosure.

FIG. 3 is a flow chart of a method 300 illustrating the manufacturing process of the memory cell unit 100 having the layout 200A, in accordance with some embodiments of the present disclosure. The method 300 is described below with reference to FIG. 2A and FIG. 2B.

In operation 305, gates 210, 220, and 230 are formed on an active region 202. The gate 220 is disposed between the gates 210 and 230. In some embodiments, the gates 210, 220, and 230 are formed by polysilicon.

In operation 310, metal lines 242, 244, 246, and 248 are formed on the active region 202. The metal line 242 is disposed between the gates 210 and 220. The metal line 244 is disposed between the gates 220 and 230. The metal lines 242 and 246 are disposed in two corresponding sides of the gate 210. The metal lines 244 and 248 are disposed in two corresponding sides of the gate 230.

Effectively, with reference to FIG. 1 and FIG. 2A, the gate 210 forms the gate terminal of the transistor M1 in FIG. 1, which is used to connect with the word line WL1. Moreover, the metal lines 242 and 246 form the source terminal and the drain terminal of the transistor M1 in FIG. 1, respectively. Similarly, the gate 220 forms the gate terminal of the transistor M2, which is used to receive VSS. The metal lines 242 and 244 form the source terminal and the drain terminal of the transistor M2, respectively. Similarly, the gate 230 forms the gate terminal of the transistor M3, which is used to connect with the word line WL2. The metal lines 244 and 248 form the source terminal and the drain terminal of the transistor M3, respectively.

In operation 315, an interconnect 250 is formed. For illustration in FIG. 2A, the interconnect 250 is formed in cells including the memory cells 110 and 120 and the dummy cell 130. In FIG. 2B, the interconnect 250 is formed on and connects the gate 220 and the metal lines 242 and 244. Effectively, with reference to FIG. 1 and FIG. 2A, the interconnect 250 is used to connect the gate terminal of the transistor M2 and the sources of the transistors M1 and M3 together.

In operation 320, contacts 262 and 264 are formed on the interconnect 250. Moreover, contacts 266 and 268 are formed on the metal lines 246 and 248, respectively.

In operation 325, with reference to FIG. 2A and FIG. 2B, a power line 280 is formed and connects the contacts 262 and 264. In some embodiments, the power line 280 is formed by a metal layer. The power line 280 is configured to be applied with VSS. As a result, the gate 220 and the metal lines 242 and 244 are connected through the interconnect 250 and the contacts 262 and 264 to VSS.

In some embodiments, the power line 280 is formed outside the memory cell unit 100 in FIG. 1. Alternatively stated, the power line 280 is formed outside the memory cells 110 and 120 and the dummy cell 130 in FIG. 2.

Moreover, with reference to FIG. 2A, a data line 285 is formed and connects the contacts 266 and 268. In some embodiments, the data line 285 is formed by a metal layer. Effectively, the data line 285 forms the bit line BL in FIG. 1. As a result, the metal line 246 forming the drain terminal of the transistor M1 in FIG. 1 is connected through the contact 266 to the data line 285 forming the bit line BL in FIG. 1. The metal line 248 forming the drain terminal of the transistor M3 in FIG. 1 is connected through the contact 268 to the data line 285 forming the bit line BL in FIG. 1.

Based on the layout implementation in FIG. 2A, the gate 220 and the metal lines 242 and 244 are connected to VSS through the interconnect 250 and the contacts 262 and 264 in the cells 110, 120, and 130. Therefore, resistance corresponding to the connections of the gate 220 and the metal lines 242 and 244 with VSS are reduced by the connection of the interconnect 250, compared with other approaches using contacts which are outside the cells to connect the gate with VSS. Moreover, because the interconnect 250 is formed in the cells 110, 120, and 130 in FIG. 2A, the layout areas is reduced, compared with other approaches using additional layout areas for the outside contacts which connect the gate with VSS.

In some embodiments, the contacts 262 and 264 in FIG. 2A are not formed. In such embodiments, the interconnect 250 is connected to the power line 280 without the contacts 262 and 264.

Figure 4A:
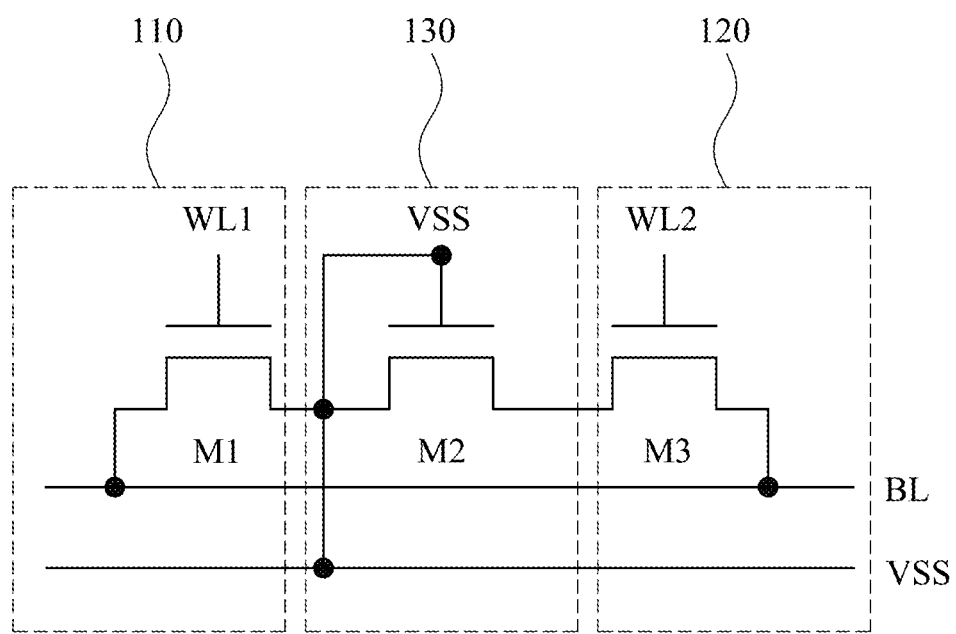
FIG. 4A is a schematic diagram of the semiconductor memory cell unit in FIG. 1 in accordance with some other embodiments of the present disclosure.

FIG. 4A is a schematic diagram of the memory cell unit 100 in accordance with some other embodiments of the present disclosure.

Compared with the memory cell 120 in FIG. 1, the source terminal of the transistor M3 in FIG. 4A is not connected to VSS.

In operation, when the word line WL2 is activated, the transistor M3 is turned on. Accordingly, the bit line BL at the drain terminal of the transistor M3 is not pulled to VSS. Therefore, the voltage value of the bit line BL is not changed to VSS through the transistor M3. In some embodiments, no VSS read out through the bit line BL indicates a logical value "1." As a result, the memory cell 120 stores the logical value "1" due to the configuration of the memory cell 120. The memory cells 110 and 120 thus store the logical value "0" and the logical value "1," respectively.

Figure 4B:
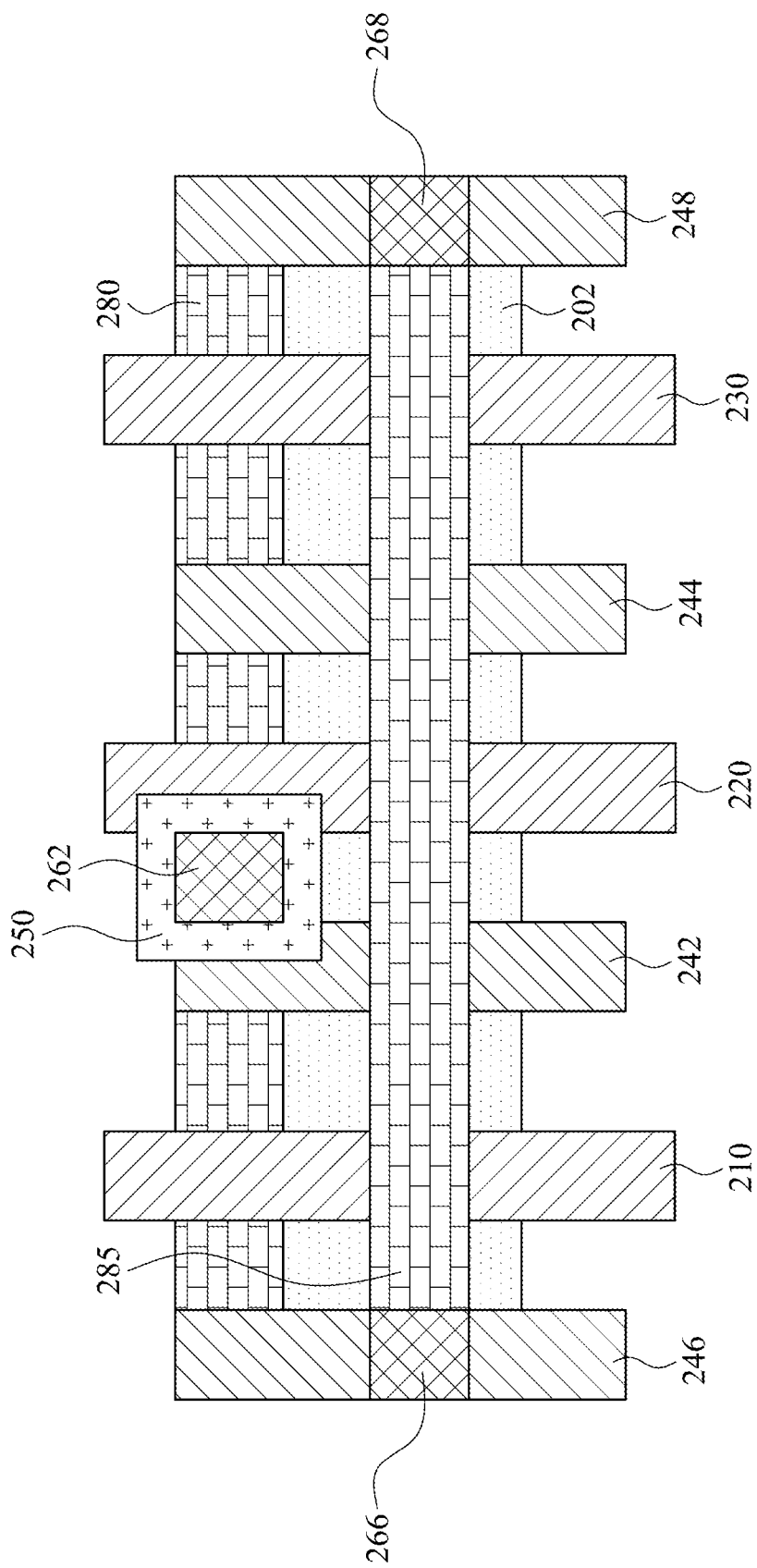
FIG. 4B is a layout diagram illustrating a layout implementation of the semiconductor memory cell unit in FIG. 4A, in accordance with some embodiments of the present disclosure.

FIG. 4B is a layout diagram illustrating a layout implementation of the semiconductor memory cell unit 100 in FIG. 4A, in accordance with some embodiments of the present disclosure.

Compared with the layout 200A in FIG. 2A, the interconnect 250 is formed on the gate 220 and the metal line 242, but is not formed on the metal line 244. As a result, the interconnect 250 connects the gate 220 and the metal line 242. Effectively, the interconnect 250 is used to connect the gate terminal of the transistor M2 and the source terminal of the transistor M1 together.

In some embodiments, the metal line 244 in FIG. 4B is not formed. As a result, there is no connection between the metal line 244 and the interconnect 250. In some embodiments, the interconnect 250 extends across the gate 220 and has no contact with the gate 230. In some other embodiments, the interconnect 250 extends across the gate 220 and has no contact with the gate 210. In various embodiments, the interconnect 250 is connected to the power line 280, and the contact 262 in FIG. 4B is not formed. In such embodiments, the interconnect 250 is connected to the power line 280 without the contact 262. The embodiments in this paragraph and those with references to FIG. 4B are separately illustrated. Any combination of the embodiments in this paragraph and those with reference to FIG. 4B is within the contemplated scope of the present disclosure.

Figure 5A:
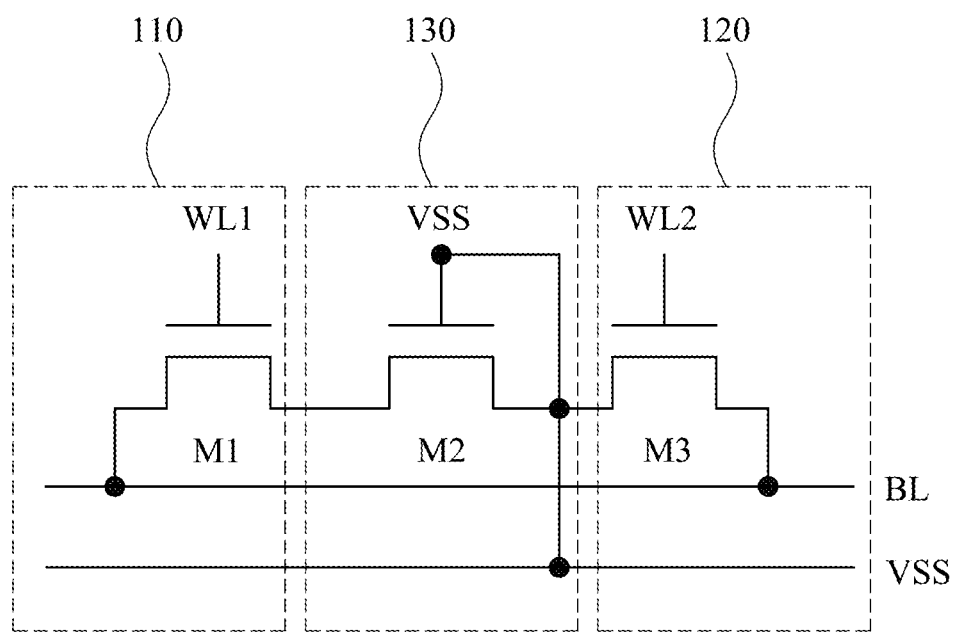
FIG. 5A is a schematic diagram of the semiconductor memory cell unit in FIG. 1 in accordance with alternative embodiments of the present disclosure.

FIG. 5A is a schematic diagram of the semiconductor memory cell unit 100 in accordance with alternative embodiments of the present disclosure.

Compared with the memory cell 110 in FIG. 1, the source terminal of the transistor M1 in FIG. 5A is not connected to VSS.

In operation, when the word line WL1 is activated, the transistor M1 is turned on. Accordingly, the bit line BL at the drain terminal of the transistor M1 is not pulled to VSS. Therefore, the voltage value of the bit line BL is not changed to VSS through the transistor M1. As a result, the memory cell 110 stores the logical value "1" due to the configuration of the memory cell 110. The memory cells 110 and 120 thus store the logical value "1" and the logical value "0," respectively.

Figure 5B:
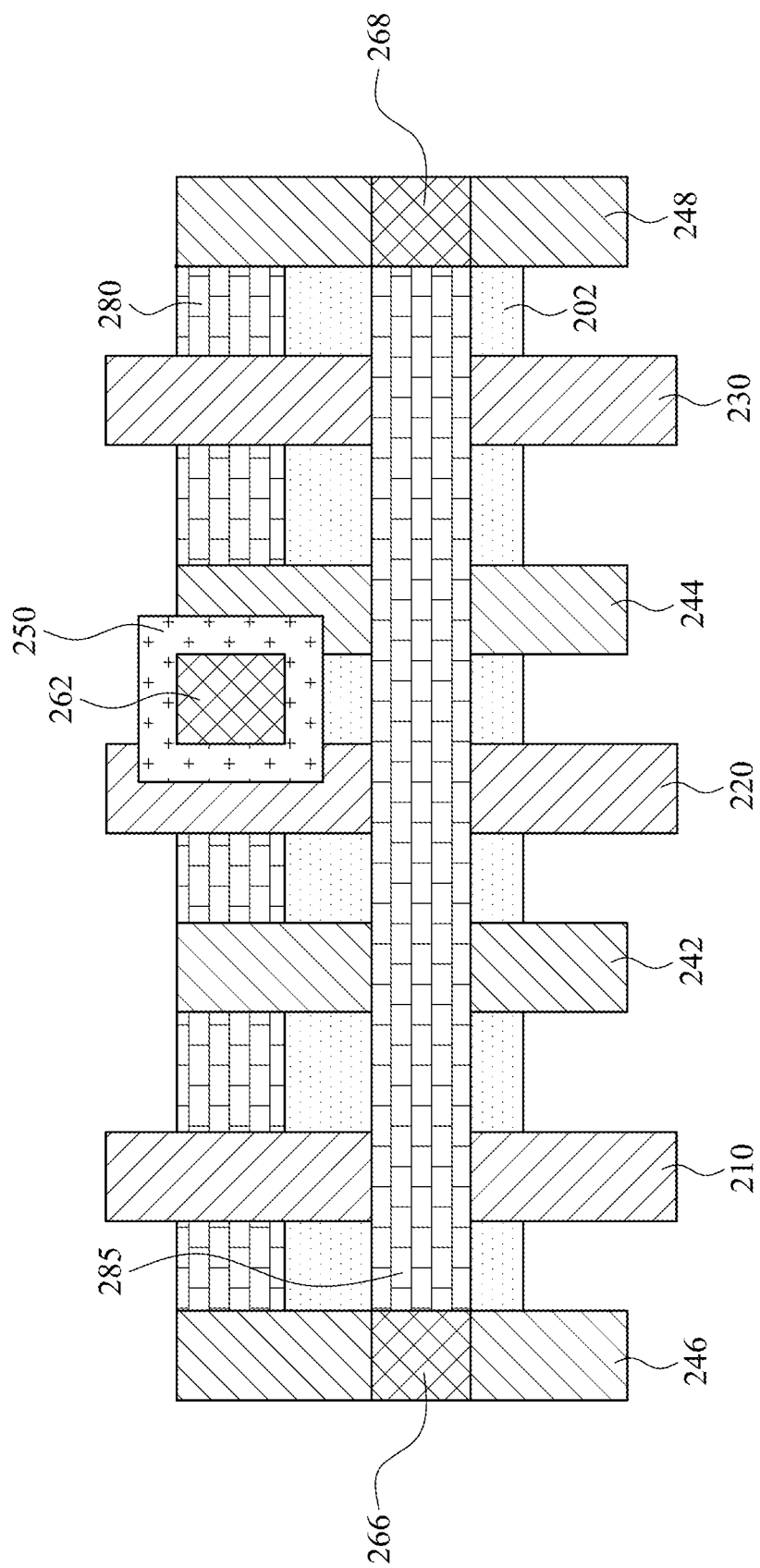
FIG. 5B is a layout diagram illustrating a layout implementation of the semiconductor memory cell unit in FIG. 5A, in accordance with some embodiments of the present disclosure.

FIG. 5B is a layout diagram illustrating a layout implementation of the semiconductor memory cell unit 100 in FIG. 5A, in accordance with some embodiments of the present disclosure.

Compared with the layout 200A in FIG. 2A, the interconnect 250 is formed on the gate 220 and the metal line 244, but is not formed on the metal line 242. As a result, the interconnect 250 connects the gate 220 and the metal line 244. Effectively, with reference to FIG. 5A and FIG. 5B, the interconnect 250 is used to connect the gate terminal of the transistor M2 and the source terminal of the transistor M1 together.

In some embodiments, the metal line 242 in FIG. 5B is not formed. As a result, there is no connection between the metal line 242 and the interconnect 250. In some embodiments, the interconnect 250 extends across the gate 220 and has no contact with the gate 210. In some other embodiments, the interconnect 250 extends across the gate 220 and has no contact with the gate 230. In various embodiments, the interconnect 250 is connected to the power line 280, and the contact 264 in FIG. 5B is not formed. In such embodiments, the interconnect 250 is connected to the power line 280 without the contact 264. The embodiments in this paragraph and those with references to FIG. 5B are separately illustrated. Any combination of the embodiments in this paragraph and FIG. 5B is within the contemplated scope of the present disclosure.

Figure 6A:
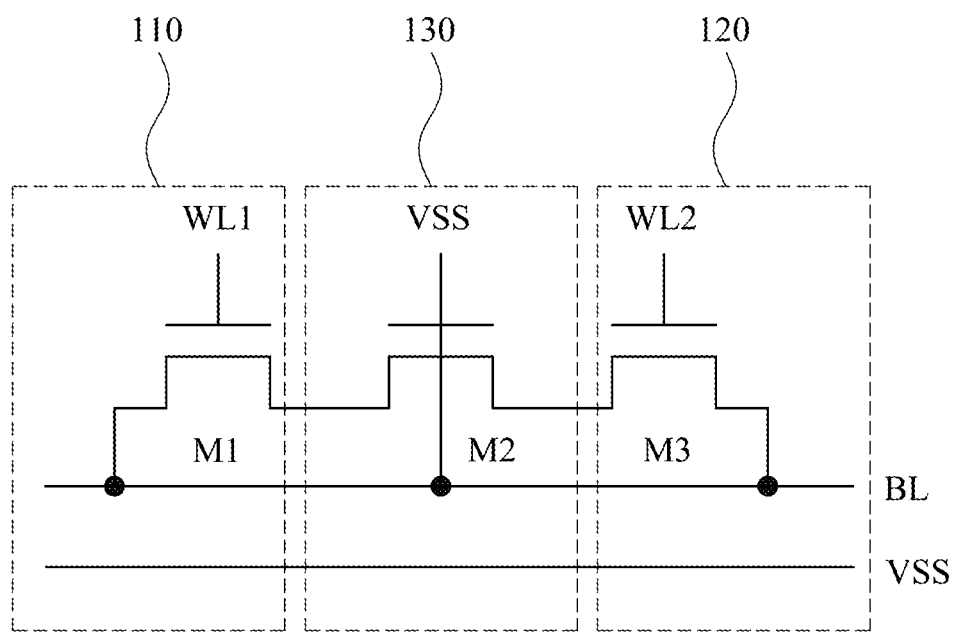
FIG. 6A is a schematic diagram of the semiconductor memory cell unit in FIG. 1 in accordance with various embodiments of the present disclosure.

FIG. 6A is a schematic diagram of the semiconductor memory cell unit 100 in accordance with various embodiments of the present disclosure.

Compared with the memory cell 110 in FIG. 1, the source terminals of the transistors M1 and M3 in FIG. 5A are not connected to VSS.

The operation of the transistor M1 is similar to that illustrated in FIG. 5A. The operation of the transistor M3 is similar to that illustrated in FIG. 4A. Therefore, the memory cells 110 and 120 store the logical value "1" and the logical value "1," respectively.

Figure 6B:
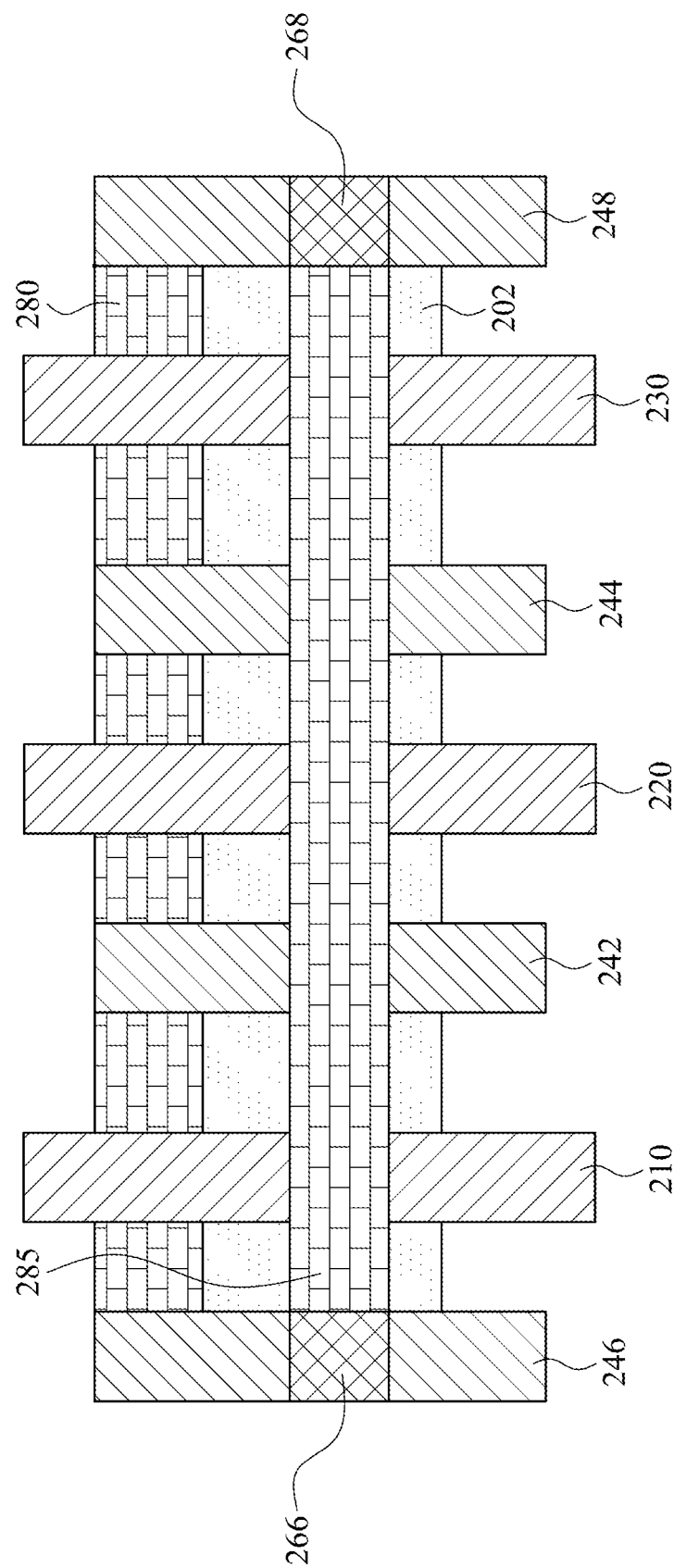
FIG. 6B is a layout diagram illustrating a layout implementation of the semiconductor memory cell unit in FIG. 6A, in accordance with some embodiments of the present disclosure.

FIG. 6B is a layout diagram illustrating a layout implementation of the semiconductor memory cell unit 100 in FIG. 6A, in accordance with some embodiments of the present disclosure.

Compared with the layout 200A in FIG. 2A, the interconnect 250 and the contacts 262 and 264 in FIG. 2A are not formed. As a result, the metal lines 242 and 244 which form the source terminals of the transistors M1 and M3, respectively, are not connected with VSS.

In some embodiments, the metal lines 242 and 244 in FIG. 6B are not formed. In some other embodiments, the interconnect 250 in FIG. 2A is formed on the gate 220 and connects with power line 280 without the contacts 262 and 264, while the metal lines 242 and 244 in FIG. 6B are not formed.

In this document, the term "contact" is also used to indicate the term "via."

In this document, the term "coupled" may also be termed as "electrically coupled", and the term "connected" may be termed as "electrically connected". "Coupled" and "connected" may also be used to indicate that two or more elements cooperate or interact with each other.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In some embodiments, a semiconductor memory cell array is disclosed that includes a memory cell unit. The memory cell unit includes an active region, a first transistor, a second transistor, a gate structure, and an interconnect. The first transistor and the second transistor are formed on the active region. The gate structure is formed on the active region and between the first transistor and the second transistor. The interconnect connects the gate structure and at least one of sources of the first transistor and the second transistor to a power line.

Also disclosed is a semiconductor memory cell array that includes a plurality of memory cells. The plurality of memory cells includes an active region, a first gate, a second gate, a third gate, a first metal line, and an interconnect. The first gate, the second gate, and the third gate are formed on the active region, and the second gate is disposed between the first gate and the third gate. The first metal line is formed on the active region, in which the first metal line is disposed between the first gate and the second gate. The interconnect connects the second gate and the first metal line to a power line.

A method is also disclosed that includes the operations below. A first gate, a second gate, and a third gate are formed on an active region, in which the second gate is disposed between the first gate and the third gate. A first metal line is formed on the active region and between the first gate and the second gate. An interconnect is formed in at least one memory cell, in which the interconnect connects the second gate and the first metal line to a power line.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A semiconductor memory cell array comprising:
a memory cell unit comprising:
an active region;
a first transistor formed on the active region;
a second transistor formed on the active region;
a gate structure formed on the active region and between the first transistor and the second transistor, and configured to be biased by a power line to electrically isolate the first transistor from the second transistor; and
an interconnect connecting the gate structure and at least one of sources of the first transistor and the second transistor to the power line.

2. The semiconductor memory cell array of claim 1, further comprising:
at least one contact formed between the interconnect and the power line.

3. The semiconductor memory cell array of claim 1, wherein the interconnect connects the gate structure and the sources of the first transistor and the second transistor to the power line.

4. The semiconductor memory cell array of claim 3, further comprising:
a plurality of contacts, wherein the gate structure and the sources of the first transistor and the second transistor are connected through the interconnect and the plurality of contacts to the power line.

5. The semiconductor memory cell array of claim 1, wherein the gate structure is configured to receive a reference voltage through the interconnect from the power line to electrically isolate the first transistor from the second transistor.

6. The semiconductor memory cell array of claim 1, further comprising:
a plurality of contacts connecting a drain of the first transistor and a drain of the second transistor, respectively, to a data line.

7. A semiconductor memory cell array comprising:
a plurality of memory cells comprising:
an active region;
a first gate, a second gate, and a third gate, wherein the first gate, the second gate, and the third gate are formed on the active region, and the second gate is disposed between the first gate and the third gate;
a first metal line formed on the active region, wherein the first metal line is disposed between the first gate and the second gate; and
an interconnect in contact with the second gate and the first metal line and connecting the second gate and the first metal line to a power line.

8. The semiconductor memory cell array of claim 7, wherein the plurality of memory cells further comprises:
a second metal line formed on the active region and disposed between the second gate and the third gate.

9. The semiconductor memory cell array of claim 8, wherein the interconnect connects the second gate and the second metal line to the power line.

10. The semiconductor memory cell array of claim 8, wherein the plurality of memory cells further comprises:
a first contact formed corresponding to the first metal line, the first contact connecting the first metal line and the second gate through the interconnect to the power line; and
a second contact formed corresponding to the second metal line, the second contact connecting the second metal line and the second gate through the interconnect to the power line.

11. The semiconductor memory cell array of claim 8, wherein the plurality of memory cells further comprises:
a third metal line formed on the active region, wherein the first metal line and the third metal line are disposed in both sides of the first gate; and
a fourth metal line formed on the active region, wherein the second metal line and the fourth metal line are disposed in both sides of the third gate.

12. The semiconductor memory cell array of claim 11, further comprising:
a plurality of contacts connecting the third metal line and the fourth metal line, respectively, to a data line.

13. The semiconductor memory cell array of claim 7, wherein the plurality of memory cells further comprises:
at least one contact connecting the first metal line and the second gate through the interconnect to the power line.

14. The semiconductor memory cell array of claim 7, wherein the interconnect extends across the second gate and has no contact with the first gate and the third gate.

15. The semiconductor memory cell array of claim 7, wherein at least one memory cell in the plurality of memory cells has a source electrically connected to the power line, and at least one memory cell in the plurality of memory cells has a source electrically isolated.

16. A method comprising:
forming a first gate, a second gate, and a third gate on an active region, wherein the second gate is disposed between the first gate and the third gate;
forming a first metal line on the active region and between the first gate and the second gate; and
forming an interconnect in at least one memory cell, wherein the interconnect is in contact with the second gate and the first metal line, and connects the second gate and the first metal line to a power line.

17. The method of claim 16, further comprising:
forming a second metal line on the active region and between the second gate and the third gate.

18. The method of claim 17, wherein the interconnect connects the second gate and the second metal line to the power line.

19. The method of claim 17, wherein
the first metal line and the second gate are connected through the interconnect and a first contact to the power line; and
the second metal line and the second gate are connected through the interconnect and a second contact to the power line.

20. The method of claim 17, further comprising:
forming a third metal line on the active region, wherein the first metal line and the third metal line are disposed in both sides of the first gate; and
forming a fourth metal line on the active region, wherein the second metal line and the fourth metal line are disposed in both sides of the third gate.

21. The method of claim 20, wherein the third metal line and the fourth metal line are connected through contacts to a data line.

22. The method of claim 16, wherein the interconnect extends across the second gate and has no contact with the first gate and the third gate.

* * * * *